United States Patent
Ye et al.

(10) Patent No.: US 7,897,495 B2
(45) Date of Patent: Mar. 1, 2011

(54) FORMATION OF EPITAXIAL LAYER CONTAINING SILICON AND CARBON

(75) Inventors: Zhiyuan Ye, San Jose, CA (US); Andrew M. Lam, San Francisco, CA (US); Yihwan Kim, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 668 days.

(21) Appl. No.: 11/609,608

(22) Filed: Dec. 12, 2006

(65) Prior Publication Data

US 2008/0138964 A1 Jun. 12, 2008

(51) Int. Cl.
*H01L 21/205* (2006.01)

(52) U.S. Cl. .................. 438/505; 438/503; 438/504; 438/508; 257/E21.042; 257/E21.103; 257/E21.106

(58) Field of Classification Search .................. 438/478, 438/479, 488, 489, 507, 503–505, 508; 257/E21.042, 257/E21.103, E21.106
See application file for complete search history.

(56) References Cited

U.S. PATENT DOCUMENTS

| | | | |
|---|---|---|---|
| 3,650,042 A | 3/1972 | Boerger et al. | |
| 3,757,733 A | 9/1973 | Reinberg | |
| 4,900,591 A | 2/1990 | Bennett et al. | |
| 4,976,996 A | 12/1990 | Monkowski et al. | |
| 5,108,792 A | 4/1992 | Anderson et al. | |
| 5,179,677 A | 1/1993 | Anderson et al. | |
| 5,186,718 A | 2/1993 | Tepman et al. | |
| 5,207,835 A | 5/1993 | Moore | |
| 5,854,095 A * | 12/1998 | Kang et al. ............ | 438/255 |
| 5,976,261 A | 11/1999 | Moslehi et al. | |
| 6,083,321 A | 7/2000 | Lei et al. | |
| 6,184,154 B1 | 2/2001 | Dietze et al. | |
| 6,221,742 B1 * | 4/2001 | Park et al. ............. | 438/488 |
| 6,232,196 B1 * | 5/2001 | Raaijmakers et al. ..... | 438/386 |
| 6,428,859 B1 | 8/2002 | Chiang et al. | |
| 6,468,924 B2 | 10/2002 | Lee et al. | |
| 6,803,297 B2 | 10/2004 | Jennings et al. | |
| 6,821,825 B2 | 11/2004 | Todd et al. | |
| 6,875,271 B2 | 4/2005 | Glenn et al. | |
| 6,897,131 B2 | 5/2005 | Ramachandran et al. | |
| 6,900,115 B2 * | 5/2005 | Todd ..................... | 438/478 |
| 6,916,398 B2 | 7/2005 | Chen et al. | |
| 6,998,153 B2 | 2/2006 | Chiang et al. | |
| 7,132,338 B2 | 11/2006 | Samoilov et al. | |

(Continued)

OTHER PUBLICATIONS

"PCT/US 07/87061—Apr. 16, 2008—Written Opinion".

(Continued)

*Primary Examiner*—Wael M Fahmy
*Assistant Examiner*—Minchul Yang
(74) *Attorney, Agent, or Firm*—Diehl Servilla, LLC

(57) ABSTRACT

Methods for formation of epitaxial layers containing silicon are disclosed. Specific embodiments pertain to the formation and treatment of epitaxial layers in semiconductor devices, for example, Metal Oxide Semiconductor Field Effect Transistor (MOSFET) devices. In specific embodiments, the formation of the epitaxial layer involves exposing a substrate in a process chamber to deposition gases including two or more silicon source such as silane and a higher order silane. Embodiments include flowing dopant source such as a phosphorus dopant, during formation of the epitaxial layer, and continuing the deposition with the silicon source gas without the phosphorus dopant.

19 Claims, 4 Drawing Sheets

U.S. PATENT DOCUMENTS

| | | | |
|---|---|---|---|
| 7,312,128 | B2 | 12/2007 | Kim et al. |
| 7,405,158 | B2 | 7/2008 | Lai et al. |
| 7,521,365 | B2 | 4/2009 | Kim et al. |
| 7,560,352 | B2 | 7/2009 | Carlson et al. |
| 7,572,715 | B2 | 8/2009 | Kim et al. |
| 7,588,980 | B2 | 9/2009 | Kim et al. |
| 7,598,178 | B2 | 10/2009 | Samoilov et al. |
| 7,605,060 | B2 | 10/2009 | Meunier-Beillard et al. |
| 2001/0028924 | A1 | 10/2001 | Sherman |
| 2001/0034123 | A1 | 10/2001 | Jeon et al. |
| 2002/0031618 | A1 | 3/2002 | Sherman |
| 2002/0068458 | A1 | 6/2002 | Chiang et al. |
| 2002/0094689 | A1 | 7/2002 | Park |
| 2002/0104481 | A1 | 8/2002 | Chiang et al. |
| 2002/0106846 | A1 | 8/2002 | Seutter et al. |
| 2003/0079686 | A1 | 5/2003 | Chen et al. |
| 2003/0129811 | A1 | 7/2003 | Raaijmakers et al. |
| 2004/0224089 | A1* | 11/2004 | Singh et al. ............ 427/255.27 |
| 2005/0079691 | A1 | 4/2005 | Kim et al. |
| 2005/0188923 | A1 | 9/2005 | Cook et al. |
| 2005/0263795 | A1* | 12/2005 | Choi et al. .................. 257/213 |
| 2006/0115933 | A1 | 6/2006 | Ye et al. |
| 2006/0115934 | A1 | 6/2006 | Kim et al. |
| 2006/0166414 | A1* | 7/2006 | Carlson et al. .............. 438/149 |
| 2006/0216876 | A1* | 9/2006 | Kim et al. .................. 438/149 |
| 2006/0234488 | A1 | 10/2006 | Kim et al. |
| 2006/0240630 | A1 | 10/2006 | Bauer et al. |
| 2007/0246354 | A1 | 10/2007 | Ellul et al. |
| 2007/0287272 | A1 | 12/2007 | Bauer et al. |
| 2008/0014721 | A1* | 1/2008 | Bauer ......................... 438/478 |
| 2008/0060938 | A1 | 3/2008 | Miller et al. |
| 2008/0066684 | A1 | 3/2008 | Patalay et al. |
| 2008/0069951 | A1 | 3/2008 | Chacin et al. |
| 2008/0182397 | A1 | 7/2008 | Lam et al. |
| 2008/0210163 | A1 | 9/2008 | Carlson et al. |

OTHER PUBLICATIONS

"PCT/US 07/87061—Apr. 16, 2008—Search Report".

USPTO Final Office Action, mailed Mar. 10, 2009, for U.S. Appl. No. 11/609,590, 13 pp.

Final Office Action in U.S. Appl. No. 11/669,550, (May 13, 2009), 10 pgs.

"USPTO Office Action mailed Sep. 5, 2008—U.S. Appl. No. 11/609,590, filed Dec. 12, 2006", 15 pages.

"PCT International Search Report mailed Oct. 1, 2008 for International Application No. PCT/US07/87050 filed Dec. 11, 2007," 3 pgs.

"PCT Written Opinion mailed Oct. 1, 2008 for International Application No. PCT/US07/87050 filed Dec. 11, 2007," 5 pgs.

Bauer, M., "Tensile Strained Selective Silicon Carbon Alloys for Recessed Source Drain Areas of Devices", *Abstract 210th ECS Meeting Oct. 29 through Nov. 3, 2006.*

Non-Final Office Action in U.S. Appl. No. 11/669,550, (Dec. 21, 2009), 23 pgs.

* cited by examiner t(epi) = 60 nm
t(top poly) = 51 nm
t(side poly) = 53 nm t(epi) = 72 nm
t(top poly) = 111 nm
t(side poly) = 58 nm t(epi) = 12 nm
t(top poly) = 72 nm
t(side poly) = 25 nm

FORMATION OF EPITAXIAL LAYER CONTAINING SILICON AND CARBON

BACKGROUND

Embodiments of the present invention generally relate to methods and apparatus for formation and treatment of epitaxial layers containing silicon and carbon. Specific embodiments pertain to methods and apparatus for the formation and treatment of epitaxial layers in semiconductor devices, for example, Metal Oxide Semiconductor Field Effect Transistor (MOSFET) devices.

The amount of current that flows through the channel of a MOS transistor is directly proportional to a mobility of carriers in the channel, and the use of high mobility MOS transistors enables more current to flow and consequently faster circuit performance. Mobility of the carriers in the channel of an MOS transistor can be increased by producing a mechanical stress in the channel. A channel under compressive strain, for example, a silicon-germanium channel layer grown on silicon, has significantly enhanced hole mobility to provide a pMOS transistor. A channel under tensile strain, for example, a thin silicon channel layer grown on relaxed silicon-germanium, achieves significantly enhanced electron mobility to provide an nMOS transistor.

An nMOS transistor channel under tensile strain can also be provided by forming one or more carbon-doped silicon epitaxial layers, which may be complementary to the compressively strained SiGe channel in a pMOS transistor. Thus, carbon-doped silicon and silicon-germanium epitaxial layers can be deposited on the source/drain of nMOS and pMOS transistors, respectively. The source and drain areas can be either flat or recessed by selective Si dry etching. When properly fabricated, nMOS sources and drains covered with carbon-doped silicon epitaxy imposes tensile stress in the channel and increases nMOS drive current.

To achieve enhanced electron mobility in the channel of nMOS transistors having a recessed source/drain using carbon-doped silicon epitaxy, it is desirable to selectively form the carbon-doped silicon epitaxial layer on the source/drain either through selective deposition or by post-deposition processing. Furthermore, it is desirable for the carbon-doped silicon epitaxial layer to contain substitutional C atoms to induce tensile strain in the channel. Higher channel tensile strain can be achieved with increased substitutional C content in a carbon-doped silicon source and drain.

Generally, sub-100 nm CMOS (complementary metal-oxide semiconductor) devices require a junction depth to be less than 30 nm. Selective epitaxial deposition is often utilized to form epitaxial layers ("epilayers") of silicon-containing materials (e.g., Si, SiGe and SiC) into the junctions. Selective epitaxial deposition permits growth of epilayers on silicon moats with no growth on dielectric areas. Selective epitaxy can be used within semiconductor devices, such as elevated source/drains, source/drain extensions, contact plugs or base layer deposition of bipolar devices.

A typical selective epitaxy process involves a deposition reaction and an etch reaction. During the deposition process, the epitaxial layer is formed on a monocrystalline surface while a polycrystalline layer is deposited on at least a second layer, such as an existing polycrystalline layer and/or an amorphous layer. The deposition and etch reactions occur simultaneously with relatively different reaction rates to an epitaxial layer and to a polycrystalline layer. However, the deposited polycrystalline layer is generally etched at a faster rate than the epitaxial layer. Therefore, by changing the concentration of an etchant gas, the net selective process results in deposition of epitaxy material and limited, or no, deposition of polycrystalline material. For example, a selective epitaxy process may result in the formation of an epilayer of silicon-containing material on a monocrystalline silicon surface while no deposition is left on the spacer.

Selective epitaxy deposition of silicon-containing materials has become a useful technique during formation of elevated source/drain and source/drain extension features, for example, during the formation of silicon-containing MOSFET (metal oxide semiconductor field effect transistor) devices. Source/drain extension features are manufactured by etching a silicon surface to make a recessed source/drain feature and subsequently filling the etched surface with a selectively grown epilayers, such as a silicon germanium (SiGe) material. Selective epitaxy permits near complete dopant activation with in-situ doping, so that the post annealing process is omitted. Therefore, junction depth can be defined accurately by silicon etching and selective epitaxy. On the other hand, the ultra shallow source/drain junction inevitably results in increased series resistance. Also, junction consumption during silicide formation increases the series resistance even further. In order to compensate for junction consumption, an elevated source/drain is epitaxially and selectively grown on the junction. Typically, the elevated source/drain layer is undoped silicon.

However, current selective epitaxy processes have some drawbacks. In order to maintain selectivity during present epitaxy processes, chemical concentrations of the precursors, as well as reaction temperatures, must be regulated and adjusted throughout the deposition process. If not enough silicon precursor is administered, then the etching reaction may dominate and the overall process is slowed down. Also, harmful over-etching of substrate features may occur. If insufficient etchant precursor is administered, then the deposition reaction may dominate, reducing the selectivity to form monocrystalline and polycrystalline materials across the substrate surface. Also, current selective epitaxy processes usually require a high reaction temperature, such as about 800° C., 1,000° C. or higher. Such high temperatures are not desirable during a fabrication process due to thermal budget considerations and possible uncontrolled nitridation reactions to the substrate surface. In addition, most of the C atoms incorporated through typical selective Si:C epitaxy processes at the higher process temperatures occupy non-substitutional (i.e. interstitial) sites of the Si lattice. By lowering growth temperature, a higher fraction of substitutional carbon level can be achieved (e.g. nearly 100% at growth temperature of 550° C.), however, the slow growth rate at these lower temperatures is undesirable for device applications, and such selective processing might not be possible at the lower temperatures.

Therefore, there is a need to have a process for epitaxially depositing silicon-containing compounds with optional dopants. Furthermore, the process should be versatile to form silicon-containing compounds with varied elemental concentrations while having a fast deposition rate and maintaining a process temperature, such as about 800° C. or less, and preferably about 700° C. or less. Such methods would be useful in the manufacture of transistor devices.

SUMMARY OF THE INVENTION

One embodiment of the present invention relates to methods of forming and processing epitaxial layers containing silicon. Other embodiments relate to methods manufacturing of fabricating transistor devices including epitaxial layers containing silicon and carbon.

In accordance with one embodiment of the present invention, a method for epitaxially forming a silicon-containing material on a substrate surface, comprises placing a substrate including a monocrystalline surface into a process chamber; exposing the substrate to an undoped deposition gas comprising a silicon source, a carbon source, and no dopant source to form a first undoped layer on the substrate; and sequentially exposing the substrate to a doped deposition gas to form an epitaxial layer on the monocrystalline surface, wherein the deposition gas comprises a dopant source and a carrier gas to form a doped layer on the first undoped layer. In one or more embodiments, the dopant comprises a phosphorus source, for example a phosphine.

In certain embodiments, the substrate is further processed by subsequently exposing the substrate to an etching gas. After exposure to an etching gas, the substrate may be processed further by purging the process chamber. In a specific embodiment, purging the process chamber occurs immediately after exposing the substrate to the etching gas. The etching gas may comprise chlorine and HCl.

According to one or more embodiments, a single process cycle comprises an undoped deposition step, a doped deposition step, exposure to etching gas and purging the process chamber, and the process cycle is repeated at least twice. In an embodiment, purging the process chamber comprises flowing only an inert gas. In on or more embodiments, the undoped deposition step is performed after the doped deposition step. The doped deposition step may further comprise flowing a silicon source together with the dopant source. The silicon source may comprise comprises monosilane and a higher order silane, for example, disilane, neopentasilane and mixtures thereof. The carbon source may comprise methylsilane.

In an embodiment of the invention, the epitaxial film is formed during a fabrication step of a transistor manufacturing process, and the method further comprises: forming a gate dielectric on a substrate; forming a gate electrode on the gate dielectric; and forming source/drain regions on the substrate on opposite sides of the electrode and defining a channel region between the source/drain regions.

The foregoing has outlined rather broadly certain features and technical advantages of the present invention. It should be appreciated by those skilled in the art that the specific embodiments disclosed may be readily utilized as a basis for modifying or designing other structures or processes within the scope of the present invention. It should also be realized by those skilled in the art that such equivalent constructions do not depart from the spirit and scope of the invention as set forth in the appended claims.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
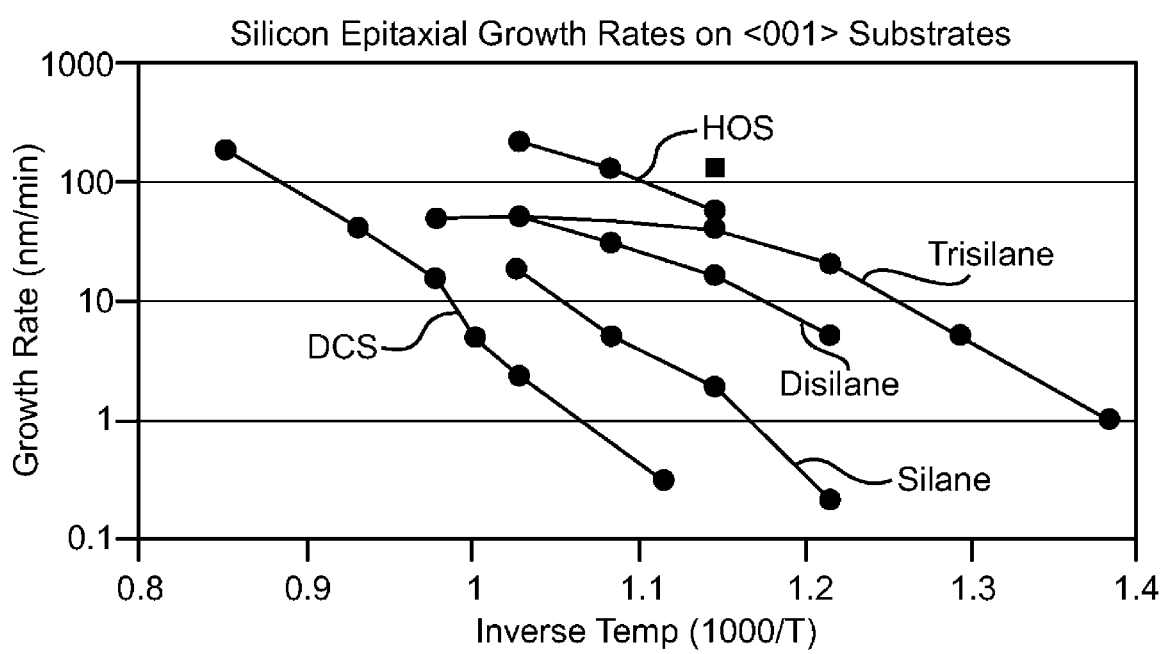
FIG. 1 is graph of epitaxial growth rate versus 1000/Temperature for several silicon precursors.

Embodiments of the invention generally provide methods and apparatus for forming and treating a silicon-containing epitaxial layer. Specific embodiments pertain to methods and apparatus for forming and treating an epitaxial layer during the manufacture of a transistor.

As used herein, epitaxial deposition refers to the deposition of a single crystal layer on a substrate, so that the crystal structure of the deposited layer matches the crystal structure of the substrate. Thus, an epitaxial layer or film is a single crystal layer or film having a crystal structure that matches the crystal structure of the substrate. Epitaxial layers are distinguished from bulk substrates and polysilicon layers.

Throughout the application, the terms "silicon-containing" materials, compounds, films or layers should be construed to include a composition containing at least silicon and may contain germanium, carbon, boron, arsenic, phosphorus, gallium and/or aluminum. Other elements, such as metals, halogens or hydrogen may be incorporated within a silicon-containing material, compound, film or layer, usually in part per million (ppm) concentrations. Compounds or alloys of silicon-containing materials may be represented by an abbreviation, such as Si for silicon, SiGe for silicon germanium, Si:C. for silicon carbon and SiGeC for silicon germanium carbon. The abbreviations do not represent chemical equations with stoichiometrical relationships, nor represent any particular reduction/oxidation state of the silicon-containing materials.

One or more embodiments of the invention generally provide processes to selectively and epitaxially deposit silicon-containing materials on monocrystalline surfaces of a substrate during fabrication of electronic devices. A substrate containing a monocrystalline surface (e.g., silicon or silicon germanium) and at least a secondary surface, such as an amorphous surface and/or a polycrystalline surface (e.g., oxide or nitride), is exposed to an epitaxial process to form an epitaxial layer on the monocrystalline surface while forming limited or no polycrystalline layer on the secondary surfaces. The epitaxial process, also referred to as the alternating gas supply process, includes repeating a cycle of a deposition process and an etching process until the desired thickness of an epitaxial layer is grown. Exemplary alternating deposition and etch processes are disclosed in commonly assigned and copending U.S. patent application Ser. No. 11/001,774, published as United States Patent Application Publication No. 2006/0115934, entitled, Selective Epitaxy Process With Alternating Gas Supply, the entire content of which is incorporated herein by reference.

In one or more embodiments, the deposition process includes exposing the substrate surface to a deposition gas containing at least a silicon source and a carrier gas. The deposition gas may also include a germanium source and/or carbon source, as well as a dopant source. During the deposition process, an epitaxial layer is formed on the monocrystalline surface of the substrate, while a polycrystalline/amorphous layer is formed on secondary surfaces, such as dielectric, amorphous and/or polycrystalline surfaces, which will be collectively referred to as "secondary surfaces". Subsequently, the substrate is exposed to an etching gas. The etching gas includes a carrier gas and an etchant, such as chlorine gas or hydrogen chloride. The etching gas removes silicon-containing materials deposited during the deposition process. During the etching process, the polycrystalline/amorphous layer is removed at a faster rate than the epitaxial layer. Therefore, the net result of the deposition and etching processes forms epitaxially grown silicon-containing material on monocrystalline surfaces while minimizing growth, if any, of polycrystalline/amorphous silicon-containing material on the secondary surfaces. A cycle of the deposition and etching processes may be repeated as needed to obtain the desired thickness of silicon-containing materials. The silicon-containing materials which can be deposited by embodiments of the invention include silicon, silicon germanium, silicon carbon, silicon germanium carbon, and variants thereof, including dopants.

In one example of the process, use of chlorine gas as an etchant lowers the overall process temperature below about 800° C. In general, deposition processes may be conducted at lower temperatures than etching reactions, since etchants often need a high temperature to be activated. For example, silane may be thermally decomposed to deposit silicon at about 500° C. or less, while hydrogen chloride requires an activation temperature of about 700° C. or higher to act as an effective etchant. Therefore, if hydrogen chloride is used during a process, the overall process temperature is dictated by the higher temperature required to activate the etchant. Chlorine contributes to the overall process by reducing the required overall process temperature. Chlorine may be activated at a temperature as low as about 500° C. Therefore, by incorporating chlorine into the process as the etchant, the overall process temperature may be significantly reduced, such as by about 200° C. to 300° C., over processes which use hydrogen chloride as the etchant. Also, chlorine etches silicon-containing materials faster than hydrogen chloride. Therefore, chlorine etchants increase the overall rate of the process.

Nitrogen is typically a preferred carrier gas due to cost considerations associated with the use of argon and helium as a carrier gas. Despite the fact that nitrogen is generally much less expensive than argon, according to one or more embodiments of the invention, argon is a preferred carrier gas, particularly in embodiments in which methylsilane is a silicon source gas. One drawback that may occur from using nitrogen as a carrier gas is the nitridizing of materials on a substrate during deposition processes. However, high temperature, such as over 800° C., is required to activate nitrogen in such a manner. Therefore, according to one or more embodiments, nitrogen can be used as an inert carrier gas in processes conducted at temperatures below the nitrogen activation threshold. The use of an inert carrier gas has several attributes during a deposition process. For one, an inert carrier gas may increase the deposition rate of the silicon-containing material. While hydrogen may be used as a carrier gas, during the deposition process, hydrogen has a tendency to adsorb or react to the substrate to form hydrogen-terminated surfaces. A hydrogen-terminated surface reacts much slower to epitaxial growth than a bare silicon surface. Therefore, the use of an inert carrier gas increases the deposition rate by not adversely effecting the deposition reaction.

According to a first embodiment of the invention, blanket or nonselective epitaxy with alternating steps of deposition and purge results in improved crystallinity of epitaxial films grown using a higher order silane compared to continuous deposition. As used herein, "higher order silane" refers to a disilane or higher silane precursor. In certain specific embodiments, "higher order silane" refers to disilane, neopentasilane (NPS), or a mixture of these. An exemplary process includes loading a substrate into a process chamber and adjusting the conditions within the process chamber to a desired temperature and pressure. Then, a deposition process is initiated to form an epitaxial layer on a monocrystalline surface of the substrate. The deposition process is then terminated. The thickness of the epitaxial layer is then determined. If the predetermined thickness of the epitaxial layer is achieved, then the epitaxial process is terminated. However, if the predetermined thickness is not achieved, then steps of deposition and purge are repeated as a cycle until the predetermined thickness is achieved. Further details of this exemplary process are described below.

The substrates may be unpatterned or patterned. Patterned substrates are substrates that include electronic features formed into or onto the substrate surface. The patterned substrate usually contains monocrystalline surfaces and at least one secondary surface that is non-monocrystalline, such as a dielectric, polycrystalline or amorphous surfaces. Monocrystalline surfaces include the bare crystalline substrate or a deposited single crystal layer usually made from a material such as silicon, silicon germanium or silicon carbon. Polycrystalline or amorphous surfaces may include dielectric materials, such as oxides or nitrides, specifically silicon oxide or silicon nitride, as well as amorphous silicon surfaces.

After loading a substrate into the process chamber, the conditions in the process chamber are adjusted to a predetermined temperature and pressure. The temperature is tailored to the particular conducted process. Generally, the process chamber is maintained at a consistent temperature throughout the epitaxial process. However, some steps may be performed at varying temperatures. The process chamber is kept at a temperature in the range from about 250° C. to about 1,000° C., for example, from about 500° C. to about 800° C. and more specifically from about 550° C. to about 750° C. The appropriate temperature to conduct epitaxial process may depend on the particular precursors used to deposit the silicon-containing. In one example, it has been found that chlorine ($Cl_2$) gas works well as an etchant for silicon-containing materials at temperatures lower than processes using more common etchants. Therefore, in one example, an exemplary temperature to pre-heat the process chamber is about 750° C. or less, for example, about 650° C. or less and more specifically about 550° C. or less. In one specific embodiment, the temperature during epitaxial growth is maintained at about 560° C.

The process chamber is usually maintained at a pressure from about 0.1 Torr to about 600 Torr, for example, from about 1 Torr to about 50 Torr. The pressure may fluctuate during and between process steps, but is generally maintained constant. In a specific embodiment, the pressure is maintained at about 10 Torr during deposition and purge.

During the deposition process the substrate is exposed to a deposition gas to form an epitaxial layer. The substrate is exposed to the deposition gas for a period of time of about 0.5 seconds to about 30 seconds, for example, from about 1 second to about 20 seconds, and more specifically from about 5 seconds to about 10 seconds. In a specific embodiment, the deposition step lasts for about 10 to 11 seconds. The specific exposure time of the deposition process is determined in relation to the exposure time during a subsequent etching process, as well as particular precursors and temperature used in the process. Generally, the substrate is exposed to the deposition gas long enough to form a maximized thickness of an epitaxial layer In one or more embodiments, the deposition gas contains at least a silicon source and a carrier gas, and may contain at least one secondary elemental source, such as a carbon source and/or a germanium source. Also, the deposition gas may further include a dopant compound to provide a source of a dopant, such as boron, arsenic, phosphorus, gallium and/or aluminum. In an alternative embodiment, the deposition gas may include at least one etchant, such as hydrogen chloride or chlorine.

The silicon source is usually provided into the process chamber at a rate in a range from about 5 sccm to about 500 sccm, preferably from about 10 sccm to about 300 sccm, and more preferably from about 50 sccm to about 200 sccm, for example, about 100 sccm. In a specific embodiment, silane is flowed at about 60 sccm. Silicon sources useful in the deposition gas to deposit silicon-containing compounds include silanes, halogenated silanes and organosilanes. Silanes include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$), as well as others. Halogenated silanes include compounds with the empirical formula $X'_ySi_xH_{(2x+2-y)}$, where X'=F, Cl, Br or I, such as hexachlorodisilane ($Si_2Cl_6$), tetrachlorosilane ($SiCl_4$), dichlorosilane ($Cl_2SiH_2$) and trichlorosilane ($Cl_3SiH$). Organosilanes include compounds with the empirical formula $R_ySi_xH_{(2x+2-y)}$, where R=methyl, ethyl, propyl or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$) and hexamethyldisilane (($CH_3$)$_6Si_2$). Organosilane compounds have been found to be advantageous silicon sources as well as carbon sources in embodiments which incorporate carbon in the deposited silicon-containing compound. According to one or more embodiments, methylsilane in an argon-containing carrier gas is a preferred silicon-containing source and carrier gas combination.

The silicon source is usually provided into the process chamber along with a carrier gas. The carrier gas has a flow rate from about 1 slm (standard liters per minute) to about 100 slm, for example, from about 5 slm to about 75 slm, and more specifically from about 10 slm to about 50 slm, for example, about 10 slm. Carrier gases may include nitrogen ($N_2$), hydrogen ($H_2$), argon, helium and combinations thereof. An inert carrier gas is preferred and includes nitrogen, argon, helium and combinations thereof. A carrier gas may be selected based on the precursor(s) used and/or the process temperature during the epitaxial process. Usually the carrier gas is the same throughout for each of the deposition and etching steps. However, some embodiments may use different carrier gases in particular steps.

Typically, nitrogen is utilized as a carrier gas in embodiments featuring low temperature (e.g., <800° C.) processes. Low temperature processes are accessible due in part to the use of chlorine gas in the etching process. Nitrogen remains inert during low temperature deposition processes. Therefore, nitrogen is not incorporated into the deposited silicon-containing material during low temperature processes. Also, a nitrogen carrier gas does not form hydrogen-terminated surfaces as does a hydrogen carrier gas. The hydrogen-terminated surfaces formed by the adsorption of hydrogen carrier gas on the substrate surface inhibit the growth rate of silicon-containing layers. Finally, the low temperature processes may take economic advantage of nitrogen as a carrier gas, since nitrogen is far less expensive than hydrogen, argon or helium. Despite the economic advantages, according to certain embodiments, argon is a preferred carrier gas.

The deposition gas used also contains at least one secondary elemental source, such as a carbon source and/or a germanium source. A carbon source may be added during deposition to the process chamber with the silicon source and carrier gas to form a silicon-containing compound, such as a silicon carbon material. A carbon source is usually provided into the process chamber at a rate in the range from about 0.1 sccm to about 20 sccm, for example, from about 0.5 sccm to about 10 sccm, and more specifically, from about 1 sccm to about 5 sccm, for example, about 2 sccm. The carbon source may be diluted in hydrogen gas and flowed at a rate of 300 sccm. Carbon sources useful to deposit silicon-containing compounds include organosilanes, alkyls, alkenes and alkynes of ethyl, propyl and butyl. Such carbon sources include methylsilane ($CH_3SiH_3$), dimethylsilane (($CH_3$)$_2$ $SiH_2$), ethylsilane ($CH_3CH_2SiH_3$), methane ($CH_4$), ethylene ($C_2H4$), ethyne ($C_2H_2$), propane ($C_3H_8$), propene ($C_3H_6$), butyne ($C_4H_6$), as well as others. The carbon concentration of an epitaxial layer is in the range from about 200 ppm to about 5 atomic %, preferably from about 1 atomic % to about 3 atomic %, for example 1.5 atomic %. In one embodiment, the carbon concentration may be graded within an epitaxial layer, preferably graded with a lower carbon concentration in the initial portion of the epitaxial layer than in the final portion of the epitaxial layer. Alternatively, a germanium source and a carbon source may both be added during deposition into the process chamber with the silicon source and carrier gas to form a silicon-containing compound, such as a silicon carbon or silicon germanium carbon material.

Alternatively, a germanium source may be added to the process chamber with the silicon source and carrier gas to form a silicon-containing compound, such as a silicon germanium material. The germanium source is usually provided into the process chamber at a rate in the range from about 0.1 sccm to about 20 sccm, preferably from about 0.5 sccm to about 10 sccm, and more preferably from about 1 sccm to about 5 sccm, for example, about 2 sccm. Germanium sources useful to deposit silicon-containing compounds include germane ($GeH_4$), higher germanes and organogermanes. Higher germanes include compounds with the empirical formula $Ge_xH_{(2x+2)}$, such as digermane ($Ge_2H_6$), trigermane ($Ge_3H_8$) and tetragermane ($Ge_4H_{10}$), as well as others. Organogermanes include compounds such as methylgermane (($CH_3$)$GeH_3$), dimethylgermane (($CH_3$)$_2GeH_2$), ethylgermane (($CH_3CH_2$)$GeH_3$), methyldigermane (($CH_3$)$Ge_2H_5$), dimethyldigermane (($CH_3$)$_2Ge_2H_4$) and hexamethyldigermane (($CH_3$)$_6Ge_2$). Germanes and organogermane compounds have been found to be advantageous germanium sources and carbon sources in embodiments while incorporating germanium and carbon into the deposited silicon-containing compounds, namely SiGe and SiGeC compounds. The germanium concentration in the epitaxial layer is in the range from about 1 atomic % to about 30 atomic %, for example, about 20 atomic %. The germanium concentration may be graded within an epitaxial layer, preferably graded with a higher germanium concentration in the lower portion of the epitaxial layer than in the upper portion of the epitaxial layer.

The deposition gas used during deposition may further include at least one dopant compound to provide a source of elemental dopant, such as boron, arsenic, phosphorus, gallium or aluminum. Dopants provide the deposited silicon-containing compounds with various conductive characteristics, such as directional electron flow in a controlled and desired pathway required by the electronic device. Films of the silicon-containing compounds are doped with particular dopants to achieve the desired conductive characteristic. In one example, the silicon-containing compound is doped p-type, such as by using diborane to add boron at a concentration in the range from about $10^{15}$ atoms/cm$^3$ to about $10^{21}$ atoms/cm$^3$. In one example, the p-type dopant has a concentration of at least $5 \times 10^{19}$ atoms/cm$^3$. In another example, the p-type dopant is in the range from about $1 \times 10^{20}$ atoms/cm$^3$ to about $2.5 \times 10^{21}$ atoms/cm$^3$. In another example, the silicon-containing compound is doped n-type, such as with phosphorus and/or arsenic to a concentration in the range from about $10^{15}$ atoms/cm$^3$ to about $10^{21}$ atoms/cm$^3$.

A dopant source is usually provided into the process chamber during deposition at a rate in the range from about 0.1 sccm to about 20 sccm, for example, from about 0.5 sccm to about 10 sccm, and more specifically from about 1 sccm to about 5 sccm, for example, about 2 sccm. Boron-containing dopants useful as a dopant source include boranes and organoboranes. Boranes include borane, diborane ($B_2H_6$), triborane, tetraborane and pentaborane, while alkylboranes include compounds with the empirical formula $R_xBH_{(3-x)}$, where R=methyl, ethyl, propyl or butyl and x=1, 2 or 3. Alkylboranes include trimethylborane (($CH_3$)$_3$B), dimethylborane (($CH_3$)$_2$BH), triethylborane (($CH_3CH_2$)$_3$B) and diethylborane (($CH_3CH_2$)$_2$BH). Dopants may also include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine (($CH_3$)$_3$P), dimethylphosphine (($CH_3$)$_2$PH), triethylphosphine (($CH_3CH_2$)$_3$P) and diethylphosphine (($CH_3CH_2$)$_2$PH). Aluminum and gallium dopant sources may include alkylated and/or halogenated derivates, such as described with the empirical formula $R_xMX_{(3-x)}$, where M=Al or Ga, R=methyl, ethyl, propyl or butyl, X=Cl or F and x=0, 1, 2 or 3. Examples of aluminum and gallium dopant sources include trimethylaluminum ($Me_3Al$), triethylaluminum ($Et_3Al$), dimethylaluminumchloride ($Me_2AlCl$), aluminum chloride ($AlCl_3$), trimethylgallium ($Me_3Ga$), triethylgallium ($Et_3Ga$), dimethylgalliumchloride ($Me_2GaCl$) and gallium chloride ($GaCl_3$).

According to one or more embodiments, after the deposition process is terminated, the process chamber may be flushed with a purge gas or the carrier gas and/or the process chamber may be evacuated with a vacuum pump. The purging and/or evacuating processes remove excess deposition gas, reaction by-products and other contaminants. In an exemplary embodiment, the process chamber may be purged for about 10 seconds by flowing a carrier gas at about 5 slm. A cycle of deposition and purge may be repeated for numerous cycles. In one embodiment, the deposition and purge cycle is repeated about 90 times.

In another aspect of the present invention, a blanket or non-selective deposition is performed at low temperatures, for example, about 600° C. and lower, using a higher order silane (e.g. disilane and higher) source. This assists in amorphous growth (rather than polycrystalline) on dielectric surfaces such as oxide and nitride during the deposition step (nonselective deposition), which facilitates removal of the layer on dielectric surfaces by a subsequent etch step and minimizes damage on single crystalline layer grown on the crystalline substrate.

FIG. 1 shows a graph of epitaxial growth rates for silicon on <001> substrates processed at various temperatures as a function of 1000/Temperature. Each of the samples was processed between 600 and 700° C. at a pressure between about 5 and 8 Torr, and delivered in hydrogen carrier gas flowing between 3-5 slm. The sample labeled "HOS" in FIG. 1 was neopentasilane and the flow rate for liquid neopentasilane in a mixture of hydrogen carrier gas through a bubbler was varied between about 20 and 300 sccm. As shown in FIG. 1, the higher order silane exhibited a growth rate at 600° C. that was about three times greater than the growth rate of trisilane, eight times the growth rate of disilane, and 72 times the growth rate of silane.

Use of a high order silane gas such as disilane, hexachlorodisilane, trisilane, and neopentasilane provides certain benefits. The use of neopentasilane in the formation of epitaxial films on substrates is described in commonly assigned U.S. application Ser. No. 10/688,797, published as United States Patent Application Publication No. 2004/0224089, entitled Silicon-Containing Layer Deposition with Silicon Compounds, the entire content of which is incorporated herein by reference. Neopentasilane, (($SiH_3$)$_4$Si), is a tertiary silane containing four silyl (—$SiH_3$) groups bonded to a silicon atom. The use of higher order silanes enables higher deposition rate at lower temperature and for silicon-containing films incorporating carbon, higher incorporation of substitutional carbon atoms than the use of mono-silane as a silicon source gas. In blanket deposition experiments conducted comparing silane as silicon a silicon source gases at a process temperature of 600° C. and using nitrogen as a carrier gas and methylsilane (1% diluted in hydrogen) as a silicon-carbon source, 50% of the carbon was substitutional carbon in the deposited films. However, with the higher order silanes, disilane produced films having greater than about 90% substitutional carbon and neopentasilane produced films having nearly 100% substitutional carbon.

In one or more embodiments, a liquid source cabinet that includes a neopentasilane ampoule installed in close proximity to the process chamber, for example, within less than about five feet, more specifically less than about two or three feet of the process chamber, enables higher delivery rate of the silicon source and consequently higher deposition rate.

Another aspect of the invention pertains to co-flowing mono silane ($SiH_4$) with a higher order silane such as neopentasilane and disilane during deposition: Although suitable for epitaxial deposition, processes that use higher order silanes during deposition generally show non-conformal growth compared processes that use mono silane: More specifically, the higher order silanes tends to produce thicker deposition on horizontal surfaces such as the bottom of recessed areas and the top of gate than deposition on vertical planes such as side wall. This non-conformal growth can lead to a problem that when etching away the unwanted deposition on the gate top to achieve selectivity, the side wall is over etched, causing what may be referred to as undercut. On the other hand, processes that utilize $SiH_4$ as the source gas tend to exhibit conformal growth. Co-flowing a higher order silane with mono silane enables tailoring of film properties, particularly at lower deposition temperatures. The ratio of the higher order silane and the mono silane (for example, by varying the flow rate of each source) can be utilized to tune the morphology of the epitaxial layer formed by the deposition process. For example, adjusting the ratio so that the flow rate of the monosilane to higher order silane is at least about 4:1 has shown to provide beneficial results compared to a process in which the ratio of mono silane to higher order silane was lower. More specifically, process runs were compared in which mono silane and disilane were flowed at a ratio of about 2.4:1 over a recessed area of the substrate and in which the mono silane and disilane were flowed at a ratio of about 4:1. The sample obtained from flowing at the ratio of 4:1 resulted in a smoother morphology than the sample obtained from flowing at the ratio of 2.4:1. Thus, ratios of mono silane to higher order silane of at least about 4:1, and in some embodiments about 5:1, can be used to improve the morphology of epitaxial films.

Figure 2A:
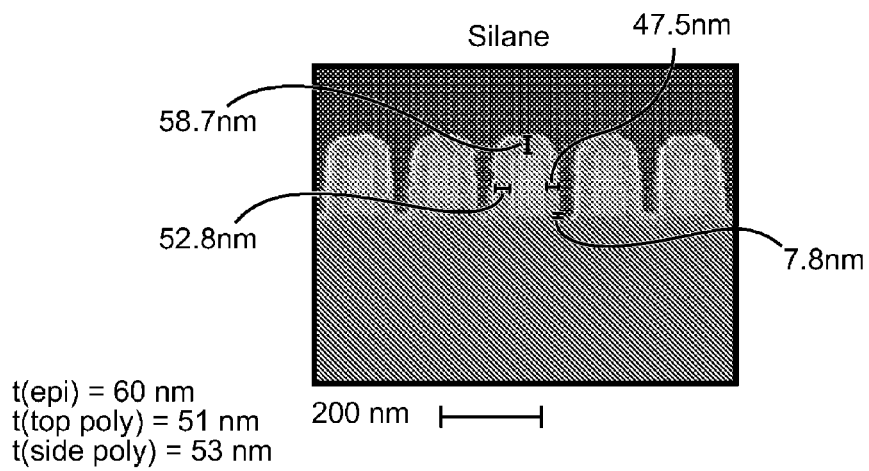
FIG. 2A is an SEM photograph showing conformality of Si:C epitaxial growth on Si substrate and dielectric structures with a silane source.
Figure 2B:
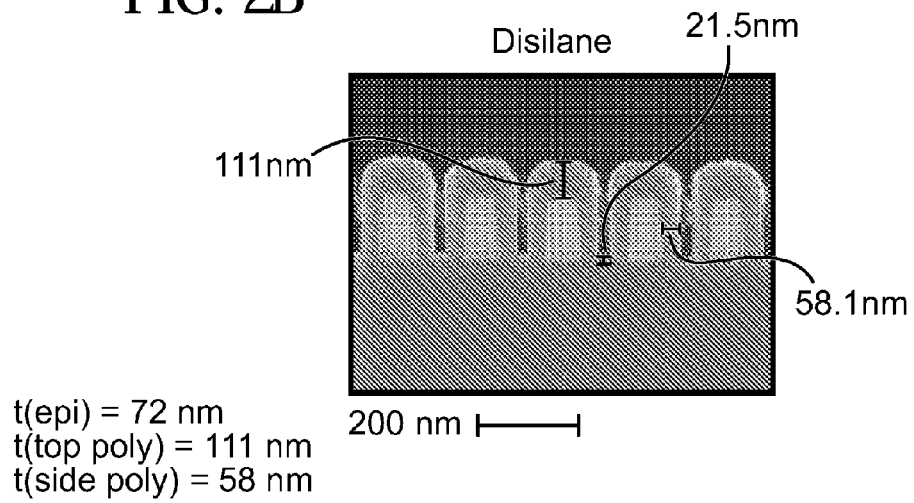
FIG. 2B is an SEM photograph showing conformality of Si:C epitaxial growth on Si substrate and dielectric structures with a disilane source.
Figure 2C:
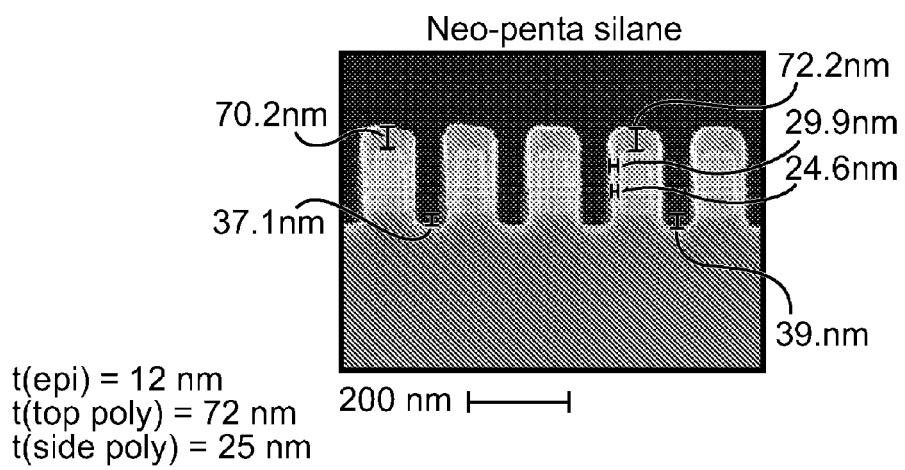
FIG. 2C is an SEM photograph showing conformality of Si:C epitaxial growth on Si substrate and dielectric structures with a neopentasilane source.

FIG. 2A shows the conformality of a silicon film containing carbon using silane as the silicon source to deposit an epitaxial film on a dielectric structure. As shown in FIG. 2A, which is a scanning electron microphotograph of a film deposited on dielectric structures, the top surface of the film is 51 nm, while the side surface of the film is shown to be 53 nm. FIG. 2B shows the conformality of a silicon film containing carbon using disilane as the silicon source to deposit an epitaxial film on a dielectric structure. As FIG. 2B shows, the top surface of the film is 111 nm thick, while the side surface of the film is 58 nm thick. FIG. 2C shows the conformality of a silicon film containing carbon using neopentasilane as the silicon source to deposit an epitaxial film on a dielectric structure. As shown in FIG. 2C, the top surface of the film is 72 nm thick, while the side surface of the film is 25 nm thick. Thus, there is a tradeoff in using higher order silanes, which provide faster deposition rate at lower temperatures, but conformal growth can be an issue.

It is believed that by adding co-flowing $SiH_4$ and a higher order silane as silicon sources to form silicon-containing epitaxial films, growth on recessed area sidewalls can be controlled and consequently the sidewall can be protected from the undercut during subsequent processing. In addition to the side wall growth, co-flowing a higher order silane with silane ($SiH_4$) is believed to improve the film quality achieved by processes using solely high order silanes. Under the same process conditions, removing $SiH_4$ from the processes that utilize higher order silanes produced films having higher haziness and poorer film crystallinity. While embodiments of the invention are not intended to be bound by a particular theory of operation, it is believed that in a process that utilizes silane with a higher order silane, silane appears to provide smaller molecules to compensate the intrinsic tension of amorphization from the larger molecules such as neopentasilane.

Thus, embodiments of the present invention provide selective epitaxy processes for silicon-containing films, for example, Si:C films with high substitutional carbon concentration (>1%), which can be used for forming tensile strained channel of N-type MOSFET structure when epitaxial films are grown on recessed source/drain of a transistor. In general, it is difficult to achieve both of high substitutional carbon concentration (>1%) in Si:C epitaxy and selective growth with smooth morphology due to low temperature process required for high substitutional carbon concentration. According to one or more embodiments of the invention, both are achieved.

Another aspect of the invention pertains to methods for in situ phosphorus doping or selective epitaxial deposition of Si:C films: In general, in situ phosphorus doping during silicon deposition decreases growth rate and increases the etch rate of a crystalline film, therefore, it makes it difficult to achieve selectivity. In other words, it is difficult to achieve crystalline growth on crystalline surfaces of the substrate without any growth on dielectric surfaces. Also, in situ phosphorus doping tends to degrade crystallinity of epitaxial films.

In certain embodiments, one or more of the aforementioned issues are avoided by what may be referred to as delta doping. In other words, only a dopant gas, for example, phosphorus dopant gas, for example, $PH_3$, and a carrier gas is flowed after undoped deposition. The phosphorus dopant gas may be flowed immediately after the undoped deposition step, or after a subsequent etch step, or after a purge step, or after both an etch and purge step. The etch and/or purge step may be repeated as necessary to achieve a high quality film. In one or more embodiments during formation of an undoped layer involves flowing only a carrier gas and a dopant source such as phosphine. By processing in this manner, one or more of the undesirable effects described above are avoided. For example, a method for epitaxially forming a silicon-containing material on a substrate surface would include placing a substrate including a monocrystalline surface into a process chamber and then exposing the substrate to an undoped deposition gas, wherein the undoped deposition gas comprises a silicon source, an optional carbon source, and no dopant source to form a first undoped layer on the substrate. Thereafter, the substrate is sequentially exposed to a doped deposition gas wherein the deposition gas comprises a dopant source and a carrier gas to form a doped layer on the first undoped layer. In one or more embodiments, the substrate can be further exposed to an undoped deposition gas to form an epitaxial layer on the monocrystalline surface, wherein the deposition gas comprises a silicon source, a carbon source and no dopant source to form a second undoped layer on the doped layer. In an example of such a process, films were made using a first deposition step by flowing NPS flowing at 120 sccm and silane at 150 sccm, methylsilane (1% diluted in Ar) at 626 sccm and phosphine (1% diluted in hydrogen) in a nitrogen carrier gas flowing at 5 slm at a growth temperature of about 560.degree. C. and a growth pressure of 10 Torr. The first deposition step was conducted for about 15 seconds. Next, a second deposition step was conducted by flowing only phosphine in carrier gas. The second deposition step was conducted at a pressure of 10 Torr and a temperature of about 560.degree. C. for about 3 seconds. The phosphine gas (1% phosphine diluted in hydrogen) was flowed at 15 sccm with nitrogen carrier gas flowing at 5 slm. Then, an etch step was conducted at a pressure of about 14.5 Torr, a temperature of about 560.degree. C., with chlorine flowing at 70 sccm, nitrogen flowing at 5 slm and HCl flowing at 300 sccm. The etch step was conducted for about 7 seconds. Next, a purge step was conducted at the same temperature and pressure for eight seconds, during which only nitrogen gas was flowed at 5 slm. Processing in this manner is expected to improve selectivity during selective epitaxy.

In other embodiments, a stack of doped/undoped layers are formed prior to etching, which blocks direct etching of doped SiC epitaxy film. Thus, according to embodiments of the invention, deposition occurs in at least two steps, doped deposition followed by undoped deposition, prior to etching. Thus, a single cycle of an embodiment of the process includes doped deposition, followed by undoped deposition, followed by etching, followed by purge, as described above. As a specific example, films were made by flowing NPS flowing at 120 sccm carried with $N_2$ at 5 slm, silane at 150 sccm, methylsilane (1% diluted in Ar) at 626 sccm and phosphine (1% diluted in hydrogen) in a nitrogen carrier gas flowing at 5 slm at a growth temperature of about 560° C. and a growth pressure of 10 Torr. The first deposition step including phosphine was conducted for about 5 seconds. Next, a second deposition step was conducted without flowing phosphine to cap the doped layer. Then, an etch step was conducted at a pressure of about 14.5 Torr, a temperature of about 560° C., with chlorine flowing at 70 sccm, nitrogen flowing at 5 slm and HCl flowing at 300 sccm. The etch step was conducted for about 7 seconds. Next, a purge step was conducted at the same temperature and pressure for eight seconds, during which only nitrogen gas was flowed at 5 slm. Of course, other variants are within the scope of the invention. For example, a deposition step may be followed by only an etch step or purge step, or alternatively, the etch step or purge step may be repeated as necessary to achieve a high quality film.

Figure 3:
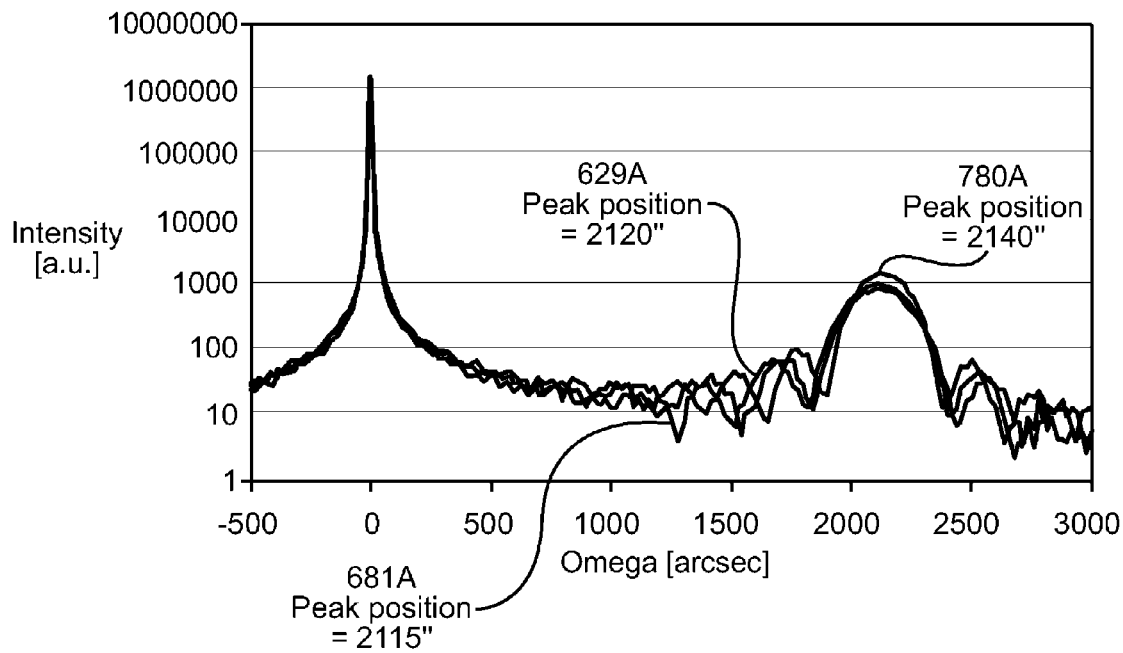
FIG. 3 is a high resolution X-ray diffraction spectra of nonselective Si:C epitaxy grown with alternating steps of deposition and purge.
Figure 4:
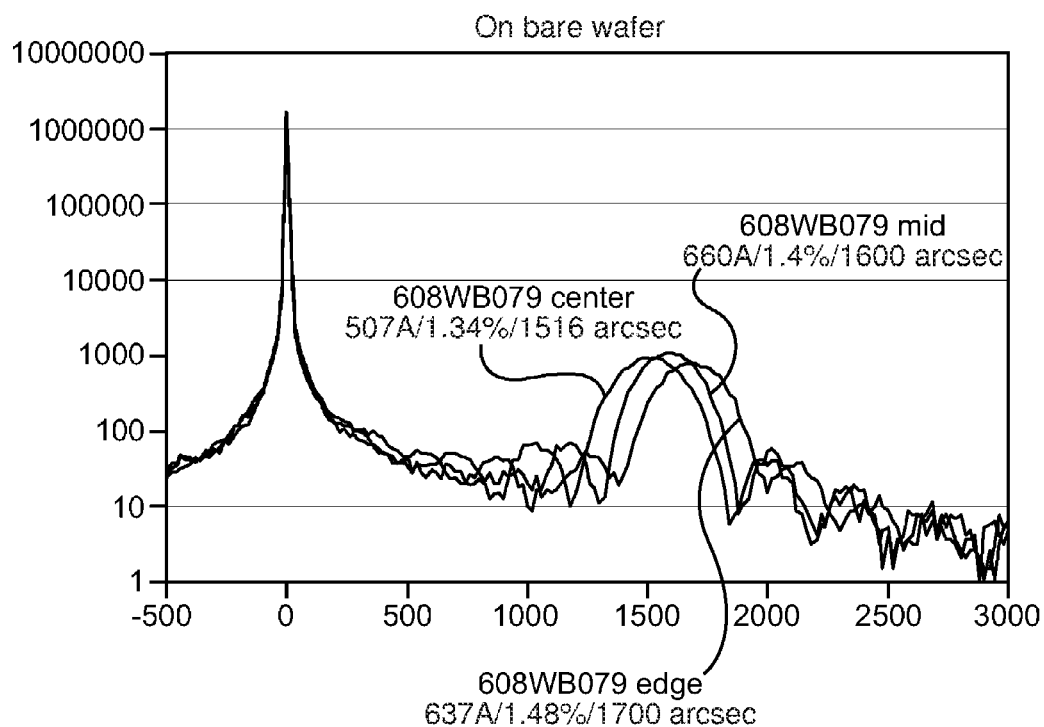
FIG. 4 is a high resolution X-ray diffraction spectra of selective Si:C epitaxy grown with alternating steps of deposition, etch, and purge.

According to other embodiments of the invention, alternating steps of deposition and purge are used during a silicon-containing film growth process. FIG. 3 shows a high resolution X-ray diffraction spectra of nonselective Si:C epitaxy grown with alternating steps of deposition and purge. It shows 2% substitutional carbon concentration. FIG. 4 shows a high resolution X-ray diffraction graph of films grown with alternating steps of deposition, etch and purge. FIG. 4 shows about 1.3 to about 1.48 atomic percent of carbon concentration. The films were made by flowing neopentasilane (NPS) carried with $N_2$ at 120 sccm, silane at 150 sccm and methylsilane (1% diluted in Ar) at 626 sccm in a nitrogen carrier gas flowing at 5 slm at a growth temperature of about 560° C. and a growth pressure of 10 Torr. Deposition was conducted for about 15 seconds. Next, an etch step was conducted at a pressure of about 14.5 Torr, a temperature of about 560° C., with chlorine flowing at 70 sccm, nitrogen flowing at 5 slm and HCl flowing at 300 sccm. The etch step was conducted for about 7 seconds. Next, a purge step was conducted at the same temperature and pressure for eight seconds, during which only nitrogen gas was flowed at 5 slm.

According to one or more embodiments, the methods follow a sequential order, however, the process is not limited to the exact steps described herein. For example, other process steps can be inserted between steps as long as the order of process sequence is maintained. The individual steps of an epitaxial deposition will now be described according to one or more embodiments.

Figure 5:
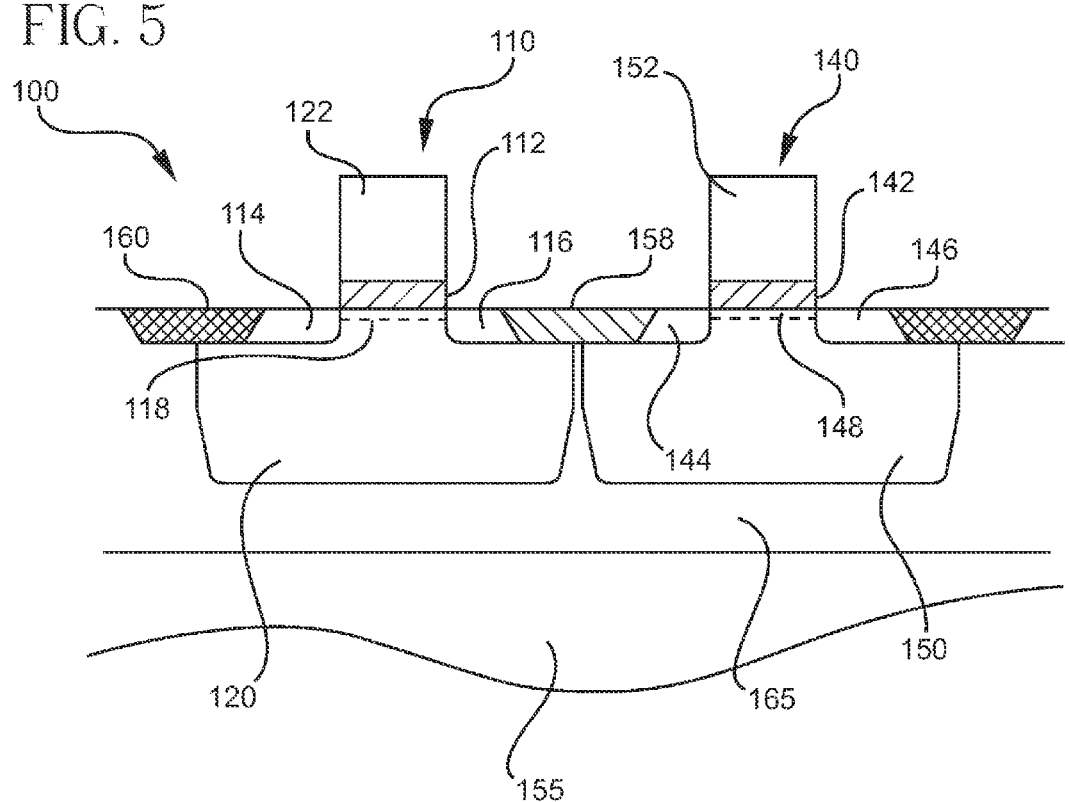
FIG. 5 is a cross-sectional view of a field effect transistor pair in accordance with an embodiment of the invention.

One or more embodiments of the present invention provide methods that are particularly useful in forming complementary metal oxide semiconductor (CMOS) integrated-circuit devices and will be described in that context. Other devices and applications are also within the scope of the invention. FIG. 5 illustrates portions of a cross sectional view of a FET pair in a typical CMOS device. Device 100 comprises a semiconductor substrate after forming wells to provide source/drain regions, gate dielectric, and gate electrode of an NMOS device and PMOS device. The device 100 can be formed using conventional semiconductor processes such as growing single crystal silicon and formation of shallow trench isolation structures by trench etching and growing or depositing dielectric in the trench openings. Detailed procedures for forming these various structures are known in the art and are not described further herein.

Device 100 comprises a semiconductor substrate 155, for example, a silicon substrate, doped with a p-type material, a p-type epitaxial silicon layer 165 on substrate 155, a p-type well region 120 and an n-type well region 150 defined in epitaxial layer 165, an n-type transistor (NMOS FET) 110 defined in p-well 120 and a p-type transistor (PMOS FET) 140 defined in n-well 150. First isolation region 158 electrically isolates NMOS 110 and PMOS 140 transistors, and second isolation region 160 electrically isolates the pair of transistors 110 and 140 from other semiconductor devices on substrate 155.

According to one or more embodiments of the invention, NMOS transistor 110 comprises a gate electrode 122, first source region 114 and a drain region 116. The thickness of the NMOS gate electrode 122 is scalable and may be adjusted based on considerations related to device performance. NMOS gate electrode 122 has a work function corresponding to the work function of a N-type device. The source and drain regions are n-type regions on opposite sides of the gate electrode 122. Channel region 118 is interposed between source region 114 and drain region 116. A gate dielectric layer 112 separates channel region 118 and gate electrode 122. Processes for forming the NMOS gate electrode 122 and dielectric layer are known in the art and are not discussed further herein.

According to one or more embodiments, PMOS transistor 140 comprises a gate electrode 152, a source region 144 and a drain region 146. The thickness of the PMOS gate electrode 152 is scalable and may be adjusted based on considerations related to device performance. PMOS gate electrode 152 has a work function corresponding to the work function of a P-type device. The source and drain regions are p-type regions on opposite sides of gate electrode 152. Channel region 148 is interposed between source region 144 and drain region 146. A gate dielectric 142 separates channel region 148 and gate electrode 152. Dielectric 142 electrically insulates gate electrode 152 from channel region 148. It will be appreciated that the structures of the transistors 110 and 140 shown in FIG. 5 and described immediately above are exemplary only, and various variants in materials, layers, etc. are within the scope of the present invention.

Figure 6:
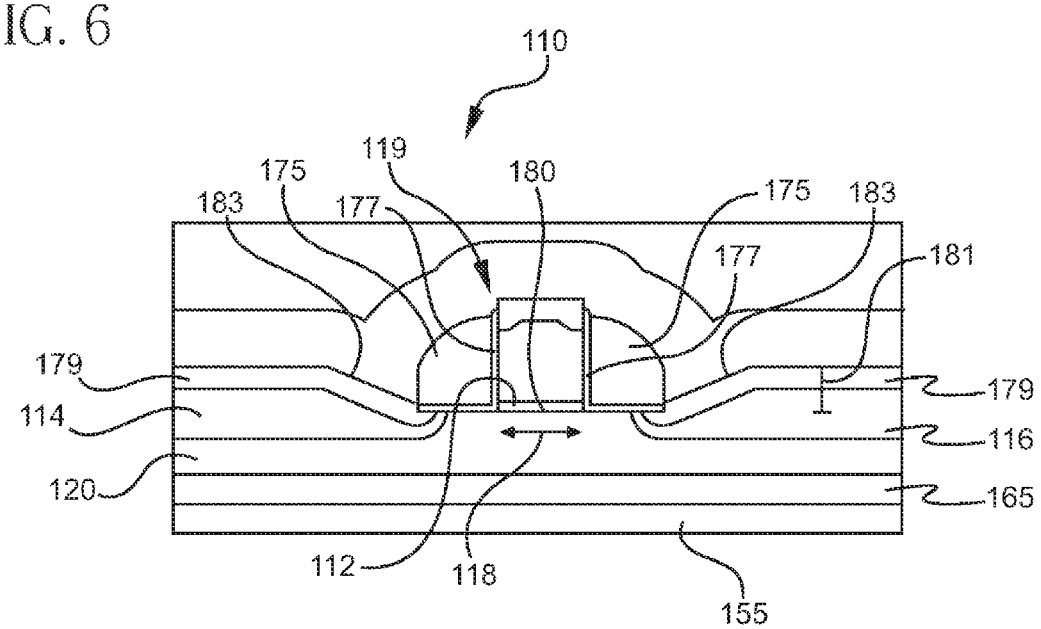
FIG. 6 is a cross-sectional view of the PMOS field effect transistor shown in FIG. 5 having additional layers formed on the device.

Referring now to FIG. 6, which shows a view of additional details of the NMOS device 110 of FIG. 5 after formation of spacers, layers over the source/drain regions, for example, silicide layers, and formation of the etch stop. It will be appreciated that the PMOS device shown in FIG. 5 may contain similar spacers and layers that may be tailored in dimensions and/or composition to affect the stress induced in the channel of the NMOS device as will be described further below. However, for illustration purposes, only NMOS device is shown and described in detail.

FIG. 6 shows spacers 175 that may be formed from suitable dielectric material incorporated around the gate 119. Offset spacers 177 may also be provided, which surround each of the spacers 175. Processes for forming shapes, sizes, and thickness of spacers 175 and 177 are known in the art and are not further described herein. A metal silicide layer 179 may be formed over the source region 114 and drain region 116. The silicide layer 179 may be formed from a suitable metal such as nickel, titanium, or cobalt by any suitable process such as sputtering or PVD (Physical Vapor Deposition). The silicide layer 179 may diffuse into portions of the underlying surfaces. Elevation of the drain region 116 is shown by the arrow 181, which is shown as the distance from the substrate surface 180 to the top of the silicide layer 179. Facet 183 of source drain region is shown as the angled surface As will be understood by the skilled artisan, the exemplary device described above may be modified to include a source/drain or source/drain extension having a Si:C epitaxial layer that may be further modified according to the methods described herein.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments. The order of description of the above method should not be considered limiting, and methods may use the described operations out of order or with omissions or additions.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

The invention claimed is:

1. A method for epitaxially forming a silicon-containing material on a substrate surface, comprising:
   placing a substrate including a monocrystalline surface into a process chamber;
   exposing the substrate to an undoped deposition gas comprising a silicon source, a carbon source, and no dopant source to form a first undoped layer on the substrate;
   sequentially exposing the substrate to a doped deposition gas to form an epitaxial layer on the monocrystalline surface, wherein the doped deposition gas consists essentially of an n-type or p-type dopant source and a carrier gas; and
   exposing the substrate to an etching gas.

2. The method of claim 1, wherein the dopant comprises a phosphorus source.

3. The method of claim 2, wherein the phosphorus source comprises phosphine.

4. The method of claim 2, further comprising purging the process chamber.

5. The method of claim 2, wherein a single process cycle comprises an undoped deposition step, a doped deposition step, exposure to etching gas and purging the process chamber, and the process cycle is repeated at least twice.

6. The method of claim 5, wherein purging the process chamber comprises flowing only an inert gas.

7. The method of claim 2, wherein the epitaxial film is formed during a fabrication step of transistor manufacturing process, and the method further comprises:
   forming a gate dielectric on a substrate;
   forming a gate electrode on the gate dielectric; and
   forming source/drain regions on the substrate on opposite sides of the electrode and defining a channel region between the source/drain regions.

8. The method of claim 1, further comprising purging the process chamber immediately after exposing the substrate to the etching gas.

9. The method of claim 8, wherein the etching gas comprises chlorine and HCl.

10. The method of claim 1, wherein the undoped deposition step is performed after the doped deposition step.

11. The method of claim 1, wherein the silicon source comprises co-flowing monosilane and a higher order silane.

12. The method of claim 11, wherein the higher order silane is selected from disilane, neopentasilane and mixtures thereof.

13. The method of claim 11, wherein the higher order silane comprises neopentasilane.

14. The method of claim 11, wherein the carbon source comprises methylsilane.

15. The method of claim 11, further comprising adjusting the ratio of the monosilane and higher order silane.

16. The method of claim 11, wherein the ratio of the silane to higher order silane exceeds 4:1.

17. The method of claim 11, wherein the higher order silane comprises disilane.

18. The method of claim 17, wherein the ratio of the monosilane to disilane is about 5:1.

19. The method of claim 1, wherein the epitaxial film is formed during a fabrication step of transistor manufacturing process, and the method further comprises:
   forming a gate dielectric on a substrate;
   forming a gate electrode on the gate dielectric; and
   forming source/drain regions on the substrate on opposite sides of the electrode and defining a channel region between the source/drain regions.

* * * * *